United States Patent [19]
Yao et al.

[11] Patent Number: 6,048,775
[45] Date of Patent: Apr. 11, 2000

[54] METHOD TO MAKE SHALLOW TRENCH ISOLATION STRUCTURE BY HDP-CVD AND CHEMICAL MECHANICAL POLISH PROCESSES

[75] Inventors: Liang-Gi Yao, Taipei; Stanley Hsu, Tainan; Randy Chang, Hsinchu; Albert Lin, Tainan, all of Taiwan

[73] Assignee: Vanguard International Semiconductor Corporation, Hsin-Chu, Taiwan

[21] Appl. No.: 09/317,913

[22] Filed: May 24, 1999

[51] Int. Cl.[7] .................................. H01L 21/76
[52] U.S. Cl. ................... 438/427; 438/424; 438/428; 438/438
[58] Field of Search .................... 438/424, 427, 438/428–438

[56] References Cited

U.S. PATENT DOCUMENTS

| | | | |
|---|---|---|---|
| 5,173,439 | 12/1992 | Dash et al. ............................ | 437/67 |
| 5,242,853 | 9/1993 | Sato et al. ............................ | 437/67 |
| 5,362,669 | 11/1994 | Boyd et al. ........................... | 437/67 |
| 5,441,094 | 8/1995 | Pasch .................................... | 156/636.1 |
| 5,459,096 | 10/1995 | Venkatesan et al. . | |
| 5,494,857 | 2/1996 | Cooperman et al. ................ | 437/228 |
| 5,504,033 | 4/1996 | Bajor et al. . | |
| 5,514,626 | 5/1996 | Hickernell et al. . | |
| 5,665,202 | 9/1997 | Subramanian et al. .............. | 438/692 |
| 5,710,076 | 1/1998 | Dai et al. ............................. | 438/305 |
| 5,721,172 | 2/1998 | Jang et al. ........................... | 438/424 |
| 5,728,621 | 3/1998 | Zheng et al. ......................... | 438/427 |
| 5,817,567 | 10/1998 | Jang et al. ........................... | 438/427 |
| 5,914,507 | 6/1999 | Polla et al. ........................... | 257/254 |
| 5,923,993 | 7/1999 | Sahota .................................. | 438/427 |
| 5,930,646 | 7/1999 | Gerung et al. ....................... | 438/341 |

OTHER PUBLICATIONS

Chang et al., ULSI Technology, The McGraw–Hill Companies, Inc., NY (1997), pp. 422–423.

*Primary Examiner*—Wael Fahmy
*Assistant Examiner*—Long Pham
*Attorney, Agent, or Firm*—George O. Saile; Stephen B. Ackerman; William J. Stoffel

[57] ABSTRACT

A method of planarizing a non-conformal HPDCVD STI oxide isolation using an underlying first nitride layer and an overlying second nitride polish stop layer. The HPDCVD oxide is deposited so that the second nitride polish stop is formed coplanar with the first nitride layer over the center of narrow trenches. Both first and second nitride layers act as polish stops. The invention forms a first nitride layer over the substrate. Wide and narrow trenches are then etched in the substrate. In an important step, a non-conformal HPDCVD oxide layer is formed filling the trenches to a level about 500 Å above the substrate surface. Then a second nitride layer is formed over the non-conformal HDPCVD oxide layer. Next, the structure is chemical-mechanical polished using both the first and nitride layers as polish stops. The second nitride layer and narrow extruded parts of the HDP-CVD oxide layer are removed in a DHF etch. Next, the first nitride layer is removed.

9 Claims, 3 Drawing Sheets

METHOD TO MAKE SHALLOW TRENCH ISOLATION STRUCTURE BY HDP-CVD AND CHEMICAL MECHANICAL POLISH PROCESSES

BACKGROUND OF INVENTION

1) Field of the Invention

This invention relates generally to a method for making integrated circuits and more particularly to the planarization of a shallow trench isolation (STI) high density plasma chemical vapor deposition (HDPCVD) isolation layer using chemical-mechanical polishing (CMP).

2) Description of the Prior Art

In fabrication of VLSI and ULSI integrated circuits, the use of fully recessed isolation, such as a process known as the "shallow trench" technique, has been used in submicron manufacturing processes to reduce surface topography related process problems associated with non-planar surfaces.

A typical structure would be formed in the following manner:
1. patterning and etching trenches in the field areas;
2. passivating and filling the trenches with a dielectric material, typically an oxide, e.g. silicon dioxide; and
3. planarizing the wafer surface.

There are numerous known methods of planarizing wafers during fabrication of integrated circuits, for example, block resist and resist etch back, block resist and spin on glass. A promising and simple method of choice is chemical mechanical polishing (CMP), CMP provides full wafer planarization without additional masking or coating steps. However, one of the difficulties encountered with CMP for trench planarization is the "dishing" effect which occurs in wide trenches (i.e. 10 $\mu$m), typical of a fully recessed field structure. "Dishing" is particularly severe in trenches wider than 20 $\mu$m and the "dishing" effect during polishing results in thinning of the dielectric in wide trenches only, and much effort has been directed to modify the polish process, equipment and materials attempt to reduce and control the dishing effect.

Moreover, the inventor has found dishing problems in narrow trenches. Also, the lack of polish stop layer over only portions of the substrate has worsened dishing effects and makes the polish endpoint less clearer. This leads to over polish problems.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,362,669(Boyd et al.) teaches a planarizing method for a conformal isolation layer 42.

U.S. Pat. No. 5,494,857(Cooperman et al) shows a STI CMP process.

U.S. Pat. No. 5,173,439(Dash et al.) discloses a STI CMP process.

U.S. Pat. No. 5,242,853(Sato et al.) teaches a ECRCVD STI fill and planarization process.

U.S. Pat. No. 5,728,621(Zheng et al.) shows a method of forming HDP oxide layers in STI and planarizing by using a SOG etchback process.

U.S. Pat. No. 5,4441,094(Pasch) shows a STI planarization process using a self-aligned poly mask.

U.S. Pat. No. 5,721,172(Jang et al) shows another self-aligned STI process using an etch.

C. Y. Chang, S. M. Sze, in *ULSI Technology*, by The McGraw-Hill Company, INC. copyright 1997, pp. 422–423, discusses HDPCVD oxide processes.

SUMMARY OF THE INVENTION

It is an object of the present invention to provide a method for fabricating a non-conformal HDPCVD STI isolation using a chemical-mechanical polish process.

It is an object of the present invention to provide a method for planarizing a non-conformal HDPCVD STI oxide isolation in both wide and narrow trenches that prevents dishing in either the wide or narrow trenches.

It is an object of the present invention to provide a method for planarizing a non-conformal HPDCVD STI oxide isolation using an overlying nitride polish stop layer where the HPDCVD oxide had a Depth to Sputter ratio so that the nitride polish stop is formed over the center of narrow trenches thereby acting as a polish stop in both the narrow and wide STI trenches.

To accomplish the above objectives, the present invention provides a method of planarizing a non-conformal HPD-CVD STI oxide isolation using an overlying second nitride (e.g, PECVD nitride) polish stop layer where the non-conformal HPDCVD oxide is deposited so that the second nitride polish stop is formed coplanar with the first nitride layer over the center of the narrow trenches. Both the first and second nitride layer act as a polish stop in both the narrow and wide STI trenches.

The invention forms a first nitride layer preferably using a LPCVD process over the substrate. Wide and Narrow trenches are etched in the substrate. In an important step, a non-conformal HDPCVD oxide layer 24 is formed filling the trenches to a level about 500 Å above the substrate surface. It important to fill the trench 500 Å above the substrate to remove the nitride layer or reoxidation process. Several hundred Å of oxide is needed as the buffer margin for preventing oxide loss which will cause the level of oxide surface under the surface of silicon substrate.

Then a second nitride layer is formed over the non-conformal HDPCVD oxide layer 24 preferably using a PECVD process. Next, the structure is chemical-mechanical polished down to the first and second nitride layers. The first nitride layer is removed preferably with a BOE or DHF dip. Then, the second nitride layer is removed.

The invention has the following key points:
① the non-conformal HDPCVD oxide layer 24—can fill wide and narrow trenches to a level about 500 Å above the surface of the substrate
② The first and second nitride layers act as etch stops over more than 75% and more preferably more than 85% of the substrate area. This prevent dishing in all trenches. This also provides a better CMP STOP signal to the CMP machine thus over polishing is reduced.

Also, the DHF wet etching rate of PECVD first nitride layer is almost the same as that of HDPCVD oxide film. So it could remove residue oxide and keep good profile as shown in FIG. 6.

① the first and second nitride layer are formed of LPCVD SIN and PECVD SIN respectively and a CMP ratio of PE-SiN to HDPCVD oxide is 2.5:1. This compares with a polish ratio of LP-SiN to HDPCVD oxide is 4:1.

The higher the CMP selectivity the better the final profile. However, LPCVD nitride could not have the same DHF etch properties of PECVD nitride film, which has almost the same etching rate as HDPCVD oxide. After DHF strip, the profile is shown in FIG. 6.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1:
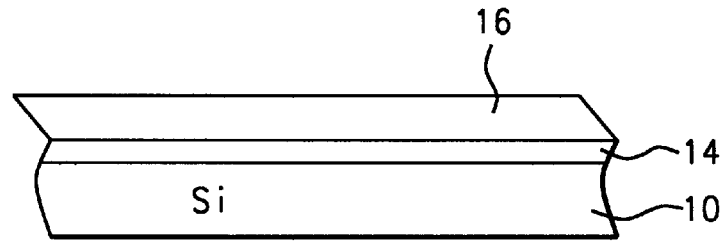
FIGS. 1, 2, 3, 4, 5, 6, and 7 are cross sectional views for illustrating a method planarizing a non-conformal HDPCVD STI oxide layer according to the present invention.

A preferred embodiment of the present invention will be described in detail with reference to the accompanying drawings. The present invention provides a method of planarizing a non-conformal HDPCVD isolation layer in a shallow trench isolation (STI) regions.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

A. Overview of a preferred embodiment

A preferred embodiment of the method includes the following steps:

1. A substrate 10 is provided having a surface and having formed thereon a pad oxide layer 14 and a first nitride layer 16. The substrate having defined therein a plurality of trenches that define active areas 11 12. The trenches are comprised of wide 22 and narrow trenches 20. The active areas are comprised of narrow active 11 areas and wide active areas 11.
2. In an important step, a non-conformal HDPCVD oxide layer 24 is formed overall extending over the surface of the first nitride layer adjacent to the trenches and filling the trench. The non-conformal HDPCVD oxide layer has a thickness sufficient to fill a center of the trenches to a level between 300 and 700 Å above the surface of the semiconductor substrate 10.
3. We form a second nitride layer 40 overlying the non-conformal HDPCVD oxide layer 24.
4. The second nitride layer 40 and the non-conformal HDPCVD oxide layer 24 are chemical-mechanical polished using the first and the second nitride layers 16 40 as polish stops. The chemical-mechanical polishing possibly leaving a residual non-conformal HDPCVD oxide layer 24A over the wide active areas.
5. The residual non-conformal HDPCVD oxide layer 24A and the residual PECVD nitride layer 24A are etched and removed over the wide active areas.
6. The first nitride layer is selectively etched and removed whereby the non-conformal HPDCVD oxide layer 24 fills the trenches to a height even with the substrate surface.

In a method of forming an integrated circuit according the present invention, a substrate for an integrated circuit is provided in the form of a P type, <100>semiconductor silicon wafer 10, as shown in FIG. 1. We provide a substrate 10 has a surface and having formed thereon a pad oxide layer 14 and a first nitride layer 16. The pad oxide layer preferably has a thickness between about 50 and 250 Å.

B. first nitride layer 16 (LPCVD nitride)

The first nitride layer 16 is preferably formed using a LPCVD nitride process. LPCVD silicon nitride can be formed by reacting The silicon nitride layer 16 can be formed by reacting silane and ammonia at atmospheric pressure at 700 to 900° C., or by reacting dichlorosilane and ammonia at reduced pressure at approximately 700° C. The first nitride layer preferably has a CMP rate ratio SiN to HDPCVD oxide of between 3:1 and 5:1 and most preferably 4:1. The first nitride layer preferably has a thickness of between about 1000 and 3000 Å. The first nitride layer has DHF etch rate within 10% of the subsequently formed non-conformal HDPCVD oxide layer 24.

C. Narrow and wide trenches

Figure 2:
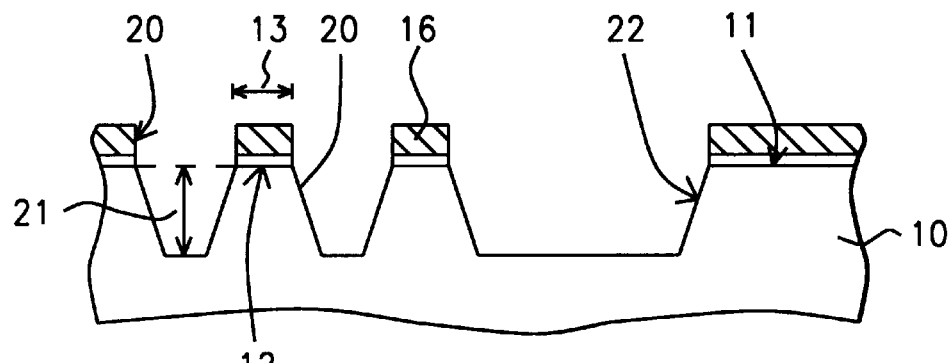

Referring to FIG. 2, the substrate having defined therein a plurality of trenches that define active areas 11 12. The trenches are comprised of wide 22 and narrow trenches 20. The active areas are comprised of narrow active 12 areas and wide active areas 11. Trench isolation regions are defined on the substrate, e.g. by a conventional photoengraving step involving coating with photoresist, and patterning. Steep sided trenches 20 22 are etched in the substrate 32 by a conventional known method of anisotropic etching.

The narrow trenches 20 preferably have a width of between about 0.05 and 0.35 μm and the wide trenches 22 preferably have a width of between about 0.4 and 20 μm and more preferably between 2 and 10 μm. The narrow and wide trenches preferably have a depth in a range of between about 500 and 3500 Å. The narrow active areas 12 preferably having a width 13 of between about 0.05 and 0.35 μm. The wide active areas 11 preferably having a width greater than 2 μm.

An optional liner oxide (not shown) is formed in the trenches. The trench liner is preferably formed by a -LPCVD process and the liner preferably has a thickness of between about 50 and 500 Å. The purpose of the trench liner is to protect the silicon sidewalls of the trench during the subsequent HDPCVD oxide layer 24 deposition.

D. The non-conformal HDPCVD oxide layer 24

Figure 3:
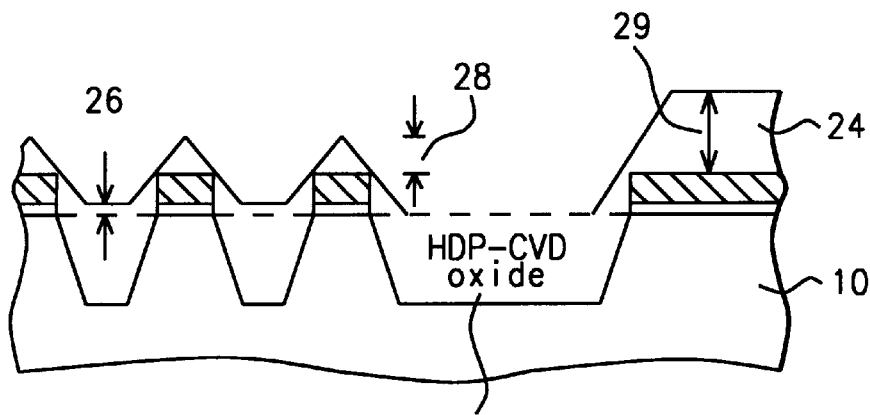

As shown in FIG. 3, we form a non-conformal HDPCVD oxide layer 24 overall extending over the surface of the first nitride layer adjacent to the trenches and filling the trench.

The non-conformal HDPCVD oxide layer has a thickness sufficient to fill a center of the trenches to a level between 300 and 700 Å above the surface of the semiconductor substrate 10.

The non-conformal HDPCVD layer is preferably deposited at a deposition to sputter ratio between 2.5:1 and 7:1.

Referring to FIG. 3, the non-conformal HDPCVD layer has a thickness 26 over the wide active areas 11 of between about 3300 and 3700 Å, for a desired thickness of 3500 Å, and the non-conformal HDPCVD layer preferably has a thickness 28 over the narrow active areas 12 of between about 300 and 800 Å.

The Invention's HDPCVD oxide layer is preferably formed at the following conditions:

| parameter | units | Low | tgt | hi |
|---|---|---|---|---|
| Process type- e.g., HDP CVD, ECR, ICP MERIE etc. | | | HPDCVD. | |
| Ar gas | sccm | 20 | 90 | 160 |
| $O_2$ gas | SCCM | 10 | 90 | 160 |
| $SiH_4$ | SCCM | 5 | 55 | 120 |
| pressure | mtorr | 2 | 8 | 10 |
| Bias power | W | 1500 | 2500 | 4000 |
| Side Power RF | W | 1500 | 2600 | 4000 |
| Top power RF | W | 500 | 1500 | 3000 |
| deposition to sputter ratio | | 2.8:1 | 5:1 | 7:1 |

The inventor has found that this process yields unexpectedly good non-conformal results.

E. optional reoxidation

Next, an optional reoxidation can be performed. The reoxidation provides 2 functions. First, the reoxidation is an anneal treatment after the HDP-CVD process. Second, it densities the HDP-CVD film as a thermal oxide.

F. second nitride layer 40

Figure 4:
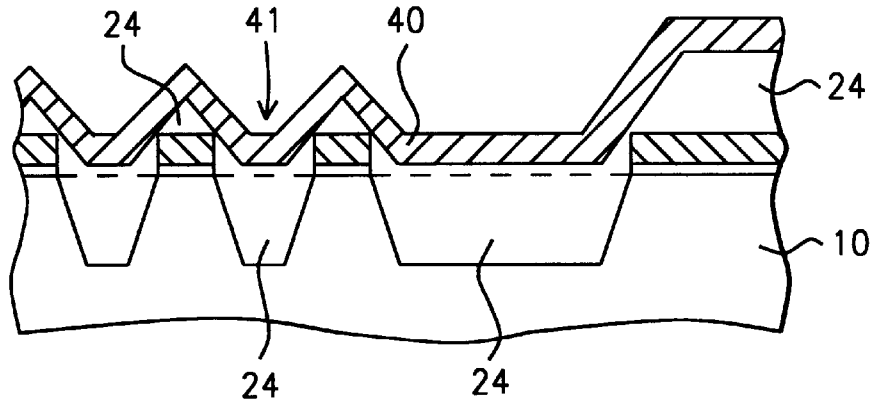

FIG. 4 shows the step of forming a second nitride layer 40 overlying the non-conformal HDPCVD oxide layer 24.

The second nitride is formed by a plasma enhanced chemical vapor deposition process and has a chemical-mechanical polish selectivity ratio PE-Nitride:oxide of between about 2:1 and 3:1.

The first and second nitride layers (16, 40) act as etch stops over more than 75% and more preferably more than 85% and most preferably more than 90% of the substrate area. This high area coverage is achievable because of the invention's non-conformal HPDCVD layer 24. See FIG. 5 that shows that the first and second nitride layers 16 40 act as etch stops over most of the substrate surface.

It is important the second silicon nitride layer is formed by a PECVD process and not by a LPCVD process because the dilute HF (DHF) is almost that of HDP-CVD oxide. This is a key point of the invention.

G. chemical-mechanical polish

Figure 5:
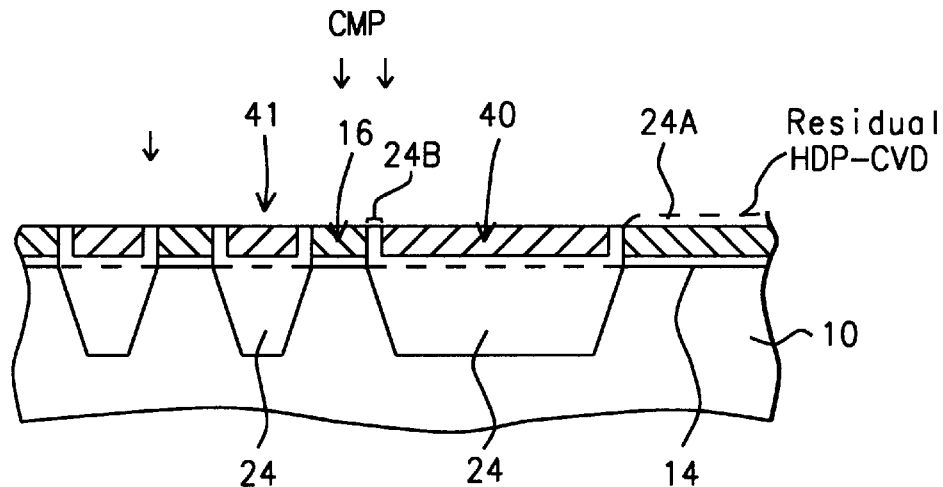

FIG. 5 shows the step of chemical-mechanical polishing the second nitride layer 40 and the non-conformal HDPCVD oxide layer 24 using the first and the second nitride layers 16 40 as polish stops. The chemical-mechanical polishing possibly leaving a residual non-conformal HDPCVD oxide layer 24A over the wide active areas 11. The formation of the residual non-conformal HDPCVD oxide is optional and is an undesired outcome of the CMP.

FIG. 5 shows the extruded portions 24B (exaggerated condition) of the HDP-CVD oxide layer. The non-conformal nature of the HDP-CVD reduces the width of these extrusions compared to a conformal oxide fill layer. This is a major advantage of the invention.

H. Optional reoxidation

Next, an optional reoxidation can be performed. The reoxidation of the Si Substrate could remove damaged layers. The reoxidation layer has thickness preferably between 50 to 250 Å.

I. Etch $2^{nd}$ Nitride layer 40 and HDPCVD oxide 24

Figure 6:
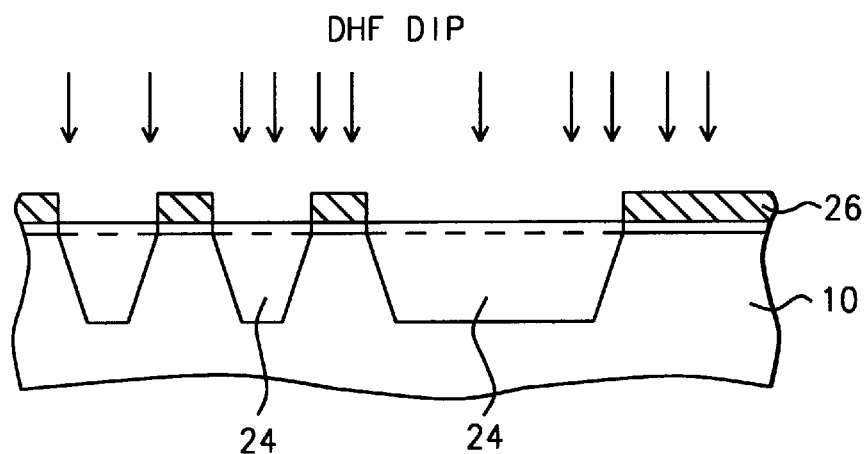

FIG. 6 shows the step of etching and removing the (if present) residual non-conformal HDPCVD oxide layer 24A over the wide active areas and the PECVD nitride (Second nitride) 40 at the same time. The etch is preferably a dilute HF (DHF) dip etch or a buffered oxide etch (BOE) etch. The PECVD nitride has about the same etch rate of the HDPCVD oxide 24 (within +/−10%). This etch removes the small extrusions 24B between the $1^{st}$ and $2^{nd}$ nitride layers. The small extrusions are narrow because of the non-conformal HDPCVD oxide layer 24. The narrow extrusions can be etched. With a non-conformal STI oxide the extrusions would be wider and would not be completely etch, thereby leaving a non-planar surface.

J. Etch $1^{st}$ nitride layer 16

Figure 7:
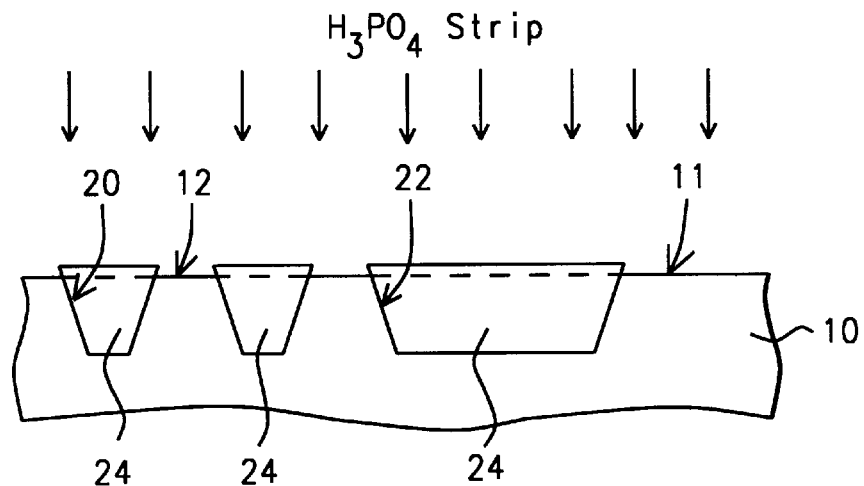

Referring to FIG. 7, we selectively etch and remove the first nitride layer 16 whereby the non-conformal HPDCVD oxide layer 24 fills the trenches to a height about even with the substrate surface. The first nitride layer 16 are preferably removed using a Hot $H_3PO_4$ etch.

Figure 8:
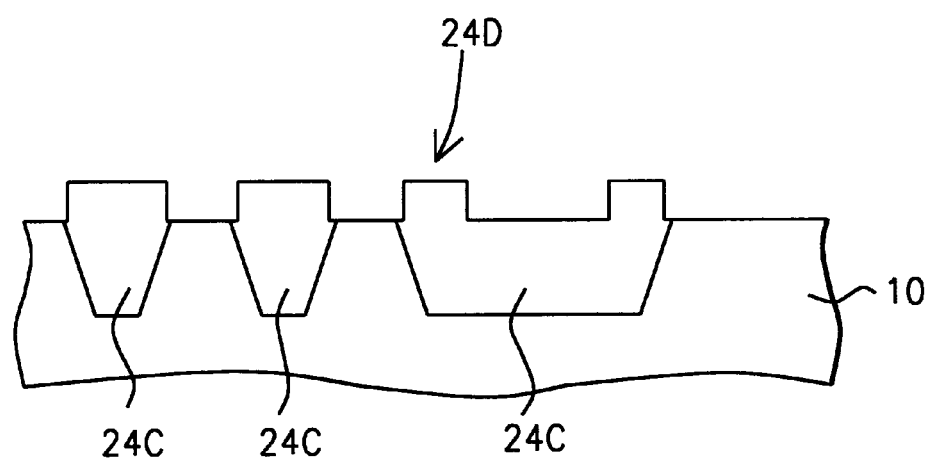
FIG. 8 is a cross sectional view for illustrating a less preferred method using a conformal STI oxide 24C that creates oxide extrusions 24D (projections) according to the present invention.

FIG. 8 show a process using a conformal STI oxide 24C. FIG. 8 shows wide oxide extrusions (i.e., projections) 24D created by the conformal oxide or oxide not as non-conformal as the present invention's HDPCVD oxide 24. FIG. 8 is shown at the stage after the $H_3PO_4$ $1^{st}$ nitride strip. The oxide extrusions 24D create a non-planar surface which is a disadvantage compared the invention's planar surface.

K. Benefits of the invention

The invention has the following key points:

① the non-conformal HDPCVD oxide layer 24—can fill wide and narrow trenches to a level about 500 Å above the top of the substrate ② The first and second nitride layers act as etch stops over more than 75% and more preferably more than 85% of the substrate area.

③ the second nitride layer 40 is formed of PECVD SIN that has a CMP ratio 1 PE-SiN to HDPCVD oxide is 2.5:1 This compares with a polish ratio of LP-SiN to HDPCVD oxide is 4:1. Also, the PE-SiN (second SIN) layer 40 has almost the same etch rate of the HDP-CVD oxide layer 24.

The higher the CMP selectivity the better the final profile. PE-SiN is better than LP-SiN for the second silicon nitride layer 24 because the wet etch rate of PECVD-second nitride layer is almost the same as that of HDP-CVD oxide. Also, the high CMP selectivity (LP-SiN (4:1) is higher than PE-SiN (2.5:1))

④ The invention's non-conformal HDP-CVD oxide layer 40 had great advantages over conformal oxides. A conformal oxide would have wider extrusions after the H3so4 nitride strip, but the extrusions are minimized in this invention.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit, comprising:
   a) providing a substrate having a surface and having formed thereon a pad oxide layer and a first nitride layer, said substrate having defined therein a plurality of trenches that define active areas; said trenches comprised of wide and narrow trenches; said active areas comprised of narrow active areas and wide active areas; said first nitride is formed by a LPCVD process;
   b) forming a non-conformal HDPCVD oxide layer overall extending over a surface of said first nitride layer adjacent to said trenches and filling said trenches, said non-conformal HDPCVD layer deposited at a deposition to sputter ratio between 2.5:1 and 7:1; and said first nitride layer has DHF etch rate within 10% of said non-conformal HDPCVD oxide layer;
   c) forming a second nitride layer overlying said non-conformal HDPCVD oxide layer; said second nitride is formed by a plasma enhanced chemical vapor deposition process and has a chemical-mechanical polish selectivity ratio PE-Nitride:HDPCVD oxide of between about 2:1 and 3:1;
   d) chemical-mechanical polishing said second nitride layer and said non-conformal HDPCVD oxide layer using said first and said second nitride layers as polish stops; said first and second nitride layers act as etch stops over more than 75% of the substrate area;
   e) etching and removing said second nitride layer; and
   f) removing said first nitride layer.

2. The method of claim 1 wherein said narrow trenches have a width of between about 0.05 $\mu$m and 0.35 $\mu$m and said wide trenches have a width of between about 0.4 $\mu$m and 20 $\mu$m.

3. The method of claim 1 wherein said non-conformal HDPCVD oxide layer has a thickness sufficient to fill a center of said trenches to a level between 300 and 700 Å above said surface of the semiconductor substrate.

4. The method of claim 1 wherein said non-conformal HDPCVD layer has a thickness over said wide active areas of between about 3300 and 3700 Å; and said non-conformal HDPCVD layer having a thickness over said narrow active areas of between about 300 and 800 Å.

5. The method of claim 1 wherein said chemical-mechanical polishing leaving a residual non-conformal HDPCVD oxide layer over said wide active areas; and etching and removing said residual non-conformal HDPCVD oxide layer over said wide active areas.

6. A method of fabricating an integrated circuit, comprising:
   a) providing a substrate having a surface and having formed thereon a pad oxide layer and a first nitride layer, said substrate having defined therein a plurality of trenches that define active areas; said trenches comprised of wide and narrow trenches; said active areas comprised of narrow active areas and wide active areas; said first nitride layer is formed using a LPCVD process;
   b) forming a non-conformal HDPCVD oxide layer overall extending over a surface of said first nitride layer adjacent to said trenches and filling said trenches,
      (1) said non-conformal HDPCVD oxide layer has a thickness sufficient to fill a center of said trenches to a level between 300 and 700 Å above said surface of the semiconductor substrate;
   c) forming a second nitride layer overlying said non-conformal HDPCVD oxide layer;
      (1) said second nitride is formed by a plasma enhanced chemical vapor deposition process and has a chemical-mechanical polish selectivity ratio PE-Nitride:oxide of between about 2:1 and 3:1;
   d) chemical-mechanical polishing said second nitride layer and said non-conformal HDPCVD oxide layer using said first and said second nitride layers as polish stops; said chemical-mechanical polishing leaving a residual non-conformal HDPCVD oxide layer over said wide active areas;
   e) etching and removing using DHF or BOE said residual non-conformal HDPCVD oxide layer over said wide active areas and said second nitride layer; and
   f) etching and removing said first nitride layer using a $H_3PO_4$ strip.

7. The method of claim 6 wherein said non-conformal HDPCVD layer deposited at a deposition to sputter ratio between 2.5:1 and 7:1.

8. The method of claim 6 wherein said first and second nitride layers act as etch stops over more than 75% of the substrate area.

9. A method of fabricating an integrated circuit, comprising:
   a) providing a substrate having a surface and having formed thereon a pad oxide layer and a first nitride layer, said substrate having defined therein a plurality of trenches that define active areas; said trenches comprised of wide and narrow trenches; said active areas comprised of narrow active areas and wide active areas;
      (1) said first nitride layer formed using an LPCVD process;
   b) forming a non-conformal HDPCVD oxide layer overall extending over a surface of said first nitride layer adjacent to said trenches and filling said trenches, said non-conformal HDPCVD oxide layer has a thickness sufficient to fill a center of said trenches to a level between 400 and 600 Å above said surface of the semiconductor substrate;
      (1) said non-conformal HDPCVD layer deposited at a deposition to sputter ratio between 2.5:1 and 7:1;
   c) forming a second nitride layer overlying said non-conformal HDPCVD oxide layer;
      (1) said second nitride is formed by a plasma enhanced chemical vapor deposition process and has a chemical-mechanical polish selectivity ratio PE-Nitride:oxide of between about 2:1 and 3:1;
   d) chemical-mechanical polishing said second nitride layer and said non-conformal HDPCVD oxide layer using said first and said second nitride layers as polish stops; said chemical-mechanical polishing leaving a residual non-conformal HDPCVD oxide layer over said wide active areas; said first and second nitride layers act as etch stops over more than 75% of the substrate area;
   e) etching and removing using a DHF dip etch or a BOE said residual non-conformal HDPCVD oxide layer over said wide active areas and said second nitride layer; and
   f) etching and removing said first nitride layer using a $H_3PO_4$ etch.

* * * * *